United States Patent
Moore et al.

(10) Patent No.: US 10,147,630 B2
(45) Date of Patent: Dec. 4, 2018

(54) SECTIONAL POROUS CARRIER FORMING A TEMPORARY IMPERVIOUS SUPPORT

(71) Applicants: John Cleaon Moore, Camirillo, CA (US); Alexander Joseph Brewer, Camarillo, CA (US); Jared Michael Pettit, Camarillo, CA (US); Alman XiMin Law, San Gabriel, CA (US)

(72) Inventors: John Cleaon Moore, Camirillo, CA (US); Alexander Joseph Brewer, Camarillo, CA (US); Jared Michael Pettit, Camarillo, CA (US); Alman XiMin Law, San Gabriel, CA (US)

(*) Notice: Subject to any disclaimer, the term of this patent is extended or adjusted under 35 U.S.C. 154(b) by 54 days.

(21) Appl. No.: 14/737,184

(22) Filed: Jun. 11, 2015

(65) Prior Publication Data
US 2015/0364356 A1    Dec. 17, 2015

Related U.S. Application Data

(60) Provisional application No. 62/010,800, filed on Jun. 11, 2014.

(51) Int. Cl.
*H01L 21/683* (2006.01)
*B32B 17/06* (2006.01)
(Continued)

(52) U.S. Cl.
CPC ............ *H01L 21/6835* (2013.01); *B32B 7/12* (2013.01); *B32B 15/02* (2013.01); *B32B 17/061* (2013.01);
(Continued)

(58) Field of Classification Search
CPC . H01L 2221/68318; H01L 2221/68322; H01L 2221/68381; H01L 21/568;
(Continued)

(56) References Cited

U.S. PATENT DOCUMENTS 6,159,827 A * 12/2000 Kataoka ............... H01L 21/304
                                                                156/750
6,491,083 B2 * 12/2002 De ..................... H01L 21/67132
                                                                156/701
(Continued)

FOREIGN PATENT DOCUMENTS

WO    WO-9744011 A1 * 11/1997 ............. A61K 9/009

*Primary Examiner* — William P Bell
(74) *Attorney, Agent, or Firm* — Andrew Auerbach

(57) ABSTRACT

Compositions and designs are described for a sectional porous carrier used in processing microelectronics where thin device substrates are affixed by adhesive to the carrier and form an impervious bonded stack that is resistant to thermal and chemical products during processing and is easily handled by a substrate handling vacuum robot, and subsequently allows rapid removal (debonding) in batch operations by directional penetration into sectional porous regions by selective liquids which release the carrier from the device wafer without harm. The invention carrier with porous regions is used for temporary support of thin and fragile device substrates having capabilities of selective penetration of chemical liquids to pass through the porous regions, access and breakdown the bonding adhesive, and allow it to release without damage to the device substrate. The sectional porous nature of the carrier allows passive diffusion of chemical liquids, the manner which in contrast to mechanical, thermal, or radiative methods, is considered to be a higher yield practice and one which enables batch processing in a manufacturing environment utilizing practices of high throughput and low cost. Preferred designs include the use of porous metal forms, including laminates, as well as surface treatment of the porous regions to facilitate exclusion principles and achieve an inert support mechanism during the stages of device manufacture. These benefits allow design flexibility and low-cost batch processing when choosing practices to handle thinned device sub- (Continued)

strates in the manufacture of semiconductors and other microelectronic devices.

8 Claims, 1 Drawing Sheet

(51) Int. Cl.
| | |
|---|---|
| *B32B 7/12* | (2006.01) |
| *B32B 37/12* | (2006.01) |
| *B32B 37/18* | (2006.01) |
| *H01L 21/56* | (2006.01) |
| *B32B 15/02* | (2006.01) |
| *B32B 37/14* | (2006.01) |
| *B32B 38/18* | (2006.01) |
| *B32B 37/00* | (2006.01) |

(52) U.S. Cl.
CPC ............ *B32B 17/067* (2013.01); *B32B 37/12* (2013.01); *B32B 37/144* (2013.01); *B32B 37/18* (2013.01); *H01L 21/568* (2013.01); B32B 37/025 (2013.01); B32B 37/187 (2013.01); B32B 2038/1891 (2013.01); B32B 2305/026 (2013.01); B32B 2307/202 (2013.01); B32B 2457/14 (2013.01); B32B 2457/20 (2013.01); *H01L 2221/68318* (2013.01); *H01L 2221/68322* (2013.01); *H01L 2221/68327* (2013.01); *H01L 2221/68381* (2013.01)

(58) Field of Classification Search
CPC ............ H01L 21/6835; H01L 21/6836; H01L 21/304; H01L 21/4832; H01L 31/1892; H01L 31/1896; H01L 27/1266; H01L 2021/6006; H01L 2221/68304; H01L 51/003; H01L 21/76259; B32B 43/006
See application file for complete search history.

(56) References Cited

U.S. PATENT DOCUMENTS

| | | | | |
|---|---|---|---|---|
| 6,492,195 | B2* | 12/2002 | Nakanishi | H01L 21/6835 257/E21.569 |
| 6,541,989 | B1* | 4/2003 | Norris | G01R 31/2831 324/754.03 |
| 7,211,168 | B2* | 5/2007 | Miyanari | H01L 21/6708 156/701 |
| 7,919,394 | B2* | 4/2011 | Nakamura | H01L 21/6835 438/458 |
| 8,080,123 | B2* | 12/2011 | Nakamura | B29C 63/0013 156/247 |
| 2001/0055928 | A1* | 12/2001 | Eevers | H01L 21/6836 442/394 |
| 2004/0092108 | A1* | 5/2004 | Yajima | B24B 37/30 438/689 |
| 2004/0191510 | A1* | 9/2004 | Kiuchi | C09J 7/0207 428/355 RA |
| 2004/0235269 | A1* | 11/2004 | Kitamura | B24B 7/228 438/460 |
| 2005/0176180 | A1* | 8/2005 | Fay | H01L 21/56 438/127 |
| 2005/0186709 | A1* | 8/2005 | Okawa | H01L 21/6836 438/113 |
| 2006/0207967 | A1* | 9/2006 | Bocko | B32B 7/06 216/24 |
| 2008/0038540 | A1* | 2/2008 | Hirayama | H01L 21/6835 428/323 |
| 2009/0199957 | A1* | 8/2009 | Inao | C09J 5/04 156/154 |
| 2010/0264566 | A1* | 10/2010 | Moore | H01L 21/6835 264/401 |
| 2011/0119910 | A1* | 5/2011 | Xu | H01L 21/568 29/832 |
| 2011/0308739 | A1* | 12/2011 | McCutcheon | H01L 21/187 156/766 |
| 2012/0276332 | A1* | 11/2012 | Conolly | C23C 14/562 428/138 |
| 2014/0154492 | A1* | 6/2014 | Traser | C09J 7/00 428/220 |

* cited by examiner

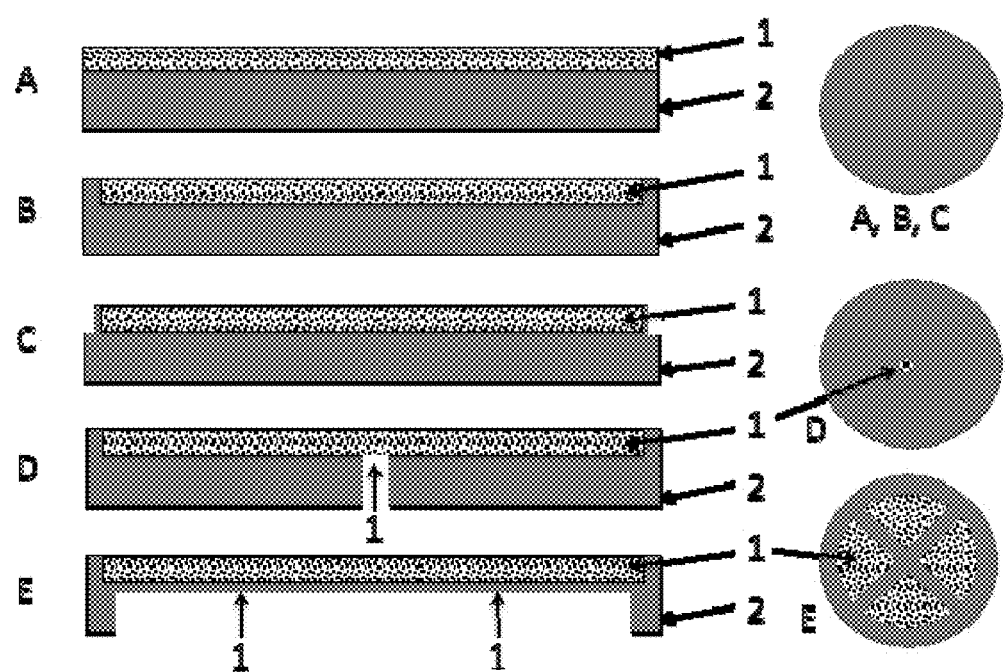

SECTIONAL POROUS CARRIER FORMING A TEMPORARY IMPERVIOUS SUPPORT

CROSS-REFERENCE TO RELATED APPLICATION

This application claims the benefit of U.S. Provisional Application No. 62/010,800, filed Jun. 11, 2014.

FIELD OF THE INVENTION

The present invention relates generally to the temporary support of thinned substrates in preparation for manufacturing microelectronic devices. Specifically, the invention describes a carrier substrate with a porosity and surface chemistry to selectively allow fluids to penetrate and come into direct contact with the adhesive used to bond onto the device substrate. More specifically, the carrier exhibits similar properties as silicon, glass, or another ceramic, yet has porosity in regions or sections ("sectional porous carrier") to allow the penetration of liquid chemistry to selected regions or sections to effect directional penetration of the given liquid to contact the adhesive at such specific areas and effect its breakdown, degradation, and otherwise dissolution leading to debonding (release) of the carrier without harm to the device substrate. The porous regions or sections of the carrier includes solid geometric areas as laminated structures. The porous regions or sections of the carrier also includes surface treatment that facilitates exclusion of chemicals during processing, yet allows passage of selective liquid chemicals used to effect debonding and release. In a preferred embodiment, the carrier release occurs while leaving the electronic device substrate without harm affixed to a taped film frame. In particular, the liquid chemistry may be prepared and heated in a tank of sufficient size that accepts a cassette or similar fixture that holds multiple sectional porous carrier bonded stacks in an immersion batch process allowing the simultaneous debonding and release of multiple sectional porous carriers. Operations conducted on multiple units per time interval ("batch processing") are consistent with the objectives of high volume manufacturing leading to increased throughput while reducing costs. Device substrates include semiconductors, microelectromechanical systems (MEMS), solar, flexible displays, and other thin solid materials that must be temporarily supported during their manufacture.

BACKGROUND OF THE INVENTION

Electronic devices face continued pressure to design and produce their configurations to a further state of miniaturization, ergonomically pleasing shapes, and a reduced weight. To achieve these goals, substrates must be thinned to 100 um (microns) and less, making them extremely fragile and difficult to handle with existing equipment. To prevent breakage, cracking, or otherwise chipping and stressing these fragile substrates, it becomes necessary to always keep them temporarily supported by an external platform, being a rigid carrier or a membrane. During microelectronic manufacturing, the thinned substrates are temporarily supported by rigid carriers, as these provide the most secure and reliable media to conduct high-resolution processes. These carrier substrates may be composed of sapphire, quartz, certain glasses, or silicon and exist in thicknesses from 0.5-1.5 mm (millimeters=500-1,500 um). The device substrate is commonly affixed to the carrier by an adhesive that offers sufficient adhesive force and quality to withstand the manufacturing process, while also allowing the thinned substrate to be removed at the completion of work without damage to its integrity.

Common tape adhesives exist which offer temporary support to the device substrate either alone or used as an interface to the carrier. These materials are commonly used for dicing operations, including high-volume photodegradative delamination practices (i.e. pick-and-place). However, tape adhesives are reserved only for the end of the process where dicing occurs. Most tape adhesives are not used in upstream microelectronic processes as their properties do not meet the needs for fabrication, including rigidity and uniformity, thermal and chemical resistance, and outgassing (weight loss). These shortcomings in adhesive tapes result in loss of adhesion, gas bubbles lodged in-between the device substrate and carrier, or produce unwanted gaseous by-products of degradation that adversely interact with the processes of vacuum deposition or etching to produce inferior results.

In the example where thinned substrates include semiconductor wafers, the device substrate is commonly removed from a carrier support, cleaned, and mounted to a film frame containing tape adhesive, allowing the dicing process to proceed. Carrier removal is conducted with robotic assisted complex tooling. Tooling is designed according to the type of adhesive chosen. At the time of this invention, there are no less than six (6) adhesive materials on the market. The majority of these adhesives require a single wafer tooling configuration whereby the tool handles one wafer at a time.

In semiconductor operations, single wafer processes that use thermoplastic adhesives may utilize thermo-mechanical demounting as taught by Thallner in U.S. Pat. Nos. 6,792,991 B2 (2004) and 2007/0155129 (2007). Device wafer separation is achieved by heating the mounted stack to a temperature above the melting point of the thermoplastic adhesive while simultaneously applying a shear force in a manner designed to separate the mounted surfaces. Cleaning with a selected organic solvent typically follows to ensure residual adhesive is cleaned from the substrate.

Another single-wafer tooling practice for removing carrier supports is described in U.S. Patent Application Nos. 2009/0017248 A1 (2009), Larson et al., 2009/0017323 A1 (2009), Webb et al., and in the International Application WO 2008/008931 A1 (2008), Webb et al. The adhesive described is a bilayer system composed of a photothermal conversion layer and a curable acrylate. The applications cite the use of a laser irradiation device which allows rapid demount of the external support carrier and is followed by a mechanical peeling practice of the curable acrylate from the thinned substrate.

Laser ablative carrier demounting practices are demonstrated in microelectronics manufacturing as described in U.S. Pat. No. 6,036,809 (2000) Kelly, et. al, U.S. Pat. No. 7,867,876B2 (2011) and U.S. Pat. No. 7,932,614B2 (2011) Codding, et. al. Laser ablative tooling is non-trivial, in that it requires exacting focus of an optical device of a specific wavelength and to do this onto an interface between the work unit and the carrier substrate. The laser's focus does this while it or the substrate is being shifted in continual motion moving rapidly across the substrate. It is well known to those familiar with the art of coatings and planarization efforts that irregularities will exist in materials applied over the surface of the work unit. The adhesives used for these practices vary between rubber, silicone, polyimide, acrylic, and the like. The laser transmits through an optically clear carrier substrate and focuses onto the interfacial region where the adhesive meets the carrier, causing a significant and immediate rise in temperature which burns the material and destroys the adhesive interface to the carrier. The laser continues rastering to the next location in an apparent smooth fashion until the entire surface of the substrate has been exposed and thereupon the carrier release is expected. The impacts of this process is realized later when irregularities are observed as micro-cracks, fissures, and residue that is burnt onto surfaces which cannot be removed. Laser ablative processes, although a common practice for debonding delicate substrates, remains a subject of much discussion when considered for high volume manufacturing.

These and other carrier debonding (removal) practices are discussed in U.S. Patent Application No. 2009/0218560A1 (2009) Flaim, et. al, where the author consolidates the practice of wafer and carrier separation into four approaches, including: 1) chemical, 2) photodecomposition (laser ablation), 3) thermomechanical, and 4) thermal decomposition. Although the author mentions drawbacks in each mechanism, they refrain from classifying them as single-wafer or batch processing according to their respective tooling configuration. Of these four processes, only chemical penetration is considered as a batch mechanism. In such processes, wafers may be populated into a cassette or holder and immersed into a chemical liquid for a designated time to allow penetration into the adhesive, emulsification, and removal to allow carrier debonding. Chemical diffusion-based debonding may require several hours to complete. At the time of this document writing, common throughput for single wafer processes are scheduled for 20-25 wafers per hour (wph). In the case of a conventional chemical debond where perforated (drilled holes) carriers are used, cassettes of between 12-25 wafers are used where debonding may last up to four (4) hours. For a bath size of >100 liters as common for most fabrication facilities in Asia, this volume can accommodate up to 4 cassettes at a time, providing throughputs between 12-25 wph, exceeding that for single wafer processes (i.e. 12-25 wafers per cassette×4 cassettes=48-100 wafers/4 hrs=12-25 wph). Without being bound to variations of the art of batch processing, this option is needed in fabrication to offer lower cost options for debonding carrier substrates. Therefore, it is a desire to consider options that enable batch wafer processing as a viable and cost effective practice for thin substrate debonding from carriers.

Other semiconductor batch debonding processes are described in U.S. Pat. No. 6,076,585 (2000) Klingbeil, et. al, and U.S. Pat. No. 6,491,083 B2 (2002) De, et. al, where a fixture holding thinned gallium arsenide (GaAs) wafers are removed from sapphire carriers using an immersion chemical practice. In both of these inventions, the fixture is designed to operate with the wafers held horizontally. The fixture has steps machined within it and requires a perforated carrier substrate that is slightly larger in diameter than the device wafer, such that during the debonding operation, the separation of the two substrates occurs by one item landing upon the fixture step while the wafer separates and falls to a lower level of support. Carrier substrates that are machined to be larger in diameter than the work unit and which have perforations (drilled holes) can be costly. For example, enlarged perforated sapphire substrates are a common choice for GaAs work unit wafers, however, these can cost $1,000 or more per unit. In the case of silicon substrates of diameters at 12" or the projected 18" (at the time of this writing, plans are projected), carrier wafers are chosen to be dummy type (i.e. same size, shape, and composition of the work unit without the electronic purity). Oversized perforated carriers are cost prohibitive for large diameter silicon as the cost of machining holes (perforations) can fall between factors of 10-100× the cost of conventional dummy sized wafers. It is a desire to avoid the use of oversized perforated carriers as a means to minimize process costs.

Semiconductor batch demounting processes are also described in U.S. Pat. No. 6,601,592 B1 (2003) and U.S. Pat. No. 6,752,160 (2004) Zhengming Chen, where two fixture cassettes work in conjunction with each other in a manner that allows separation of the device wafer from carrier substrates. The inventions describe the batch process separation between device wafer and carrier as conducted such that the top fixture cassette is populated with the mounted wafers whereby during liquid immersion, the chemistry penetrates the adhesive contact to release the two substrates. The top fixture cassette is constructed in a manner to allow only the device wafer pass downwards to the lower fixture cassette during gravity assisted separation, retaining the carrier substrate. The inventions require the sized of the carrier substrate and device wafer to be different, either the device wafer to exhibit a flat edge (i.e. wafer flat) or the carrier substrate to be oversized as compared to the device wafer. In either case, when the process commences and the fixture cassettes are arranged vertically, the oversize carrier is held back within the above fixture cassette while the device wafer travels from the top to the bottom cassette. Device wafers with a flat location were at one-time popular for reasons of reference location when handling and transferring from one process to another. The wafer flat is less desirable as it eliminates valuable device manufacturing realty on the wafer and reduces the number of devices built upon a substrate. Conversely, oversized carrier wafers are cost prohibitive as described earlier in this document. Further and most important, these inventions describe fixture design that requires the device wafer to be separated and released from the carrier substrate and move freely from one fixture cassette to another during liquid chemical immersion processing. It is commonly understood in the practice of thin wafer handling, that at anytime during this work, the device wafer should always be supported and never left to move freely. Consistent device wafer support would minimize irregular bending, vibration, and edge contact that would generate cracks, chipping, and other flaws within a thin wafer. It is a desire to avoid fixtures that require device wafer flat designs or oversized carriers and to avoid fixtures that promote a batch processing practice which allows the device wafer to move freely and subject itself to cracks, flaws, or other signs of breakage.

A unique semiconductor carrier formation and process for separation from the device wafer is described in the International Publication No. WO 210/107851 A2 (International Application No. PCT/US210/027560), Moore, et al, where a carrier substrate is manufactured (formed) directly onto the device wafer in a manner sufficient to support grinding and backside processing and when complete, the materials used to form the carrier are designed to break down in a liquid chemistry cleaning process. Carrier digestion during a cleans process requires a special fixture to support the device wafer without damage and the simultaneous multiple processing of such items during a batch operation. Once the carrier is digested and removed, the device wafer is anticipated to exhibit some level of mobility within the special fixture. The movement of a thin fragile substrate within a mechanical fixture is anticipated to produce cracks, fissures, and other irregularities due to vibration and movement of the liquid. It is a desire to promote a batch process which mandates support of the device wafer during carrier debonding.

The use of porous carriers in processing a work piece is described in U.S. Pat. 7,708,854 B2 (2010) Kroninger et al., where the author discusses the affixing (bonding) the carrier to the work piece and grinding or polishing to desired level followed by chemical diffusion through the porous carrier with chemicals to effect release and separation of the work piece. The claims describe the practice yet suffers from several fundamental aspects that are important for mainstream microelectronics processing. The first aspect is the claim by the author to apply liquid adhesive to the carrier. While the lay reader may not find this to be of critical concern, it should be understood that the majority of microelectronic processing where thin handling is required by a carrier support, the adhesive is always applied to the device substrate. Applying liquid adhesive to the device substrate allows coverage and curing over topography. The protection of the topography by planarizing or flattening this zone will reduce the occurrence of bubbles or voids in and around the topography. Second, the use of vacuum assisted adhesive coating and penetration will result in reduced performance during debond and become a source of contamination. Adhesive is applied as a liquid to the porous carrier and begins to penetrate and fill the pores. Vacuum is applied which pulls the adhesive further into the pores deep inside the carrier. This practice effectively forms a solid composite structure comprising the adhesive and porous carrier. This solid structure discourages effect of chemical fluids on the adhesive and stops the passage of fluid through the porous carrier. Chemical action on the adhesive within the porous carrier actually dissolves slower as compared to a pure solid of adhesive (bulk form of same dimensions). This is due to the fundamental model of plastics and polymers when in exposed to solvent liquids. According to the model, there is a series of steps in dissolving adhesive/polymer/plastic. The steps include: exposure, absorption, swelling, saturation, break-up and passage to bulk fluid, and finally, further reduction in the bulk fluid. Adhesive that is present in the porous carrier begins to absorb solvent, it swells, increase its volume, however, the porous structure limits continued volume expansion. Therefore, the adhesive present in the porous carrier is slow to reach saturation and in turn will even be slower to break-up and enter the bulk solvent. Adhesive present in the pores of the carrier will remain much longer as compared to a pure form bulk adhesive specimen. Third, the author describes the porous carrier to be open (porous, permeable) after bonding (i.e. bonded to work piece). The bottom of the porous carrier is open, not sealed. This condition is not satisfactory for microelectronic processing. Open or porous carriers require excessive pump-down times during vacuum assisted plasma processes. Further, open or porous substrates allow chemical intrusion and become impossible to effectively clean prior to the next process step. In this condition, the porous carrier becomes a serious source of contamination in the fabrication area causing yield reduction and high scrap rates. There is a need for a porous carrier whereby adhesive is not applied directly to its structure, is not vacuum assisted to force adhesive into its pores, and is completely closed (impervious to chemicals) such that the bonded stack will support microelectronic fabrication (backside processing).

There exist compelling arguments to encourage batch process designs with specially designed porous carriers that avoid the high cost of perforated carriers, discourage costly and complex fixtures, control protection and safety to device substrates, and ensures continual support of the device substrate throughout the process. For these reasons and others not mentioned, it is a desire to create a carrier that supports a device substrate during fabrication high volume manufacturing using vacuum assisted handling tools and is able to be exposed to thermal and chemicals and that also debonds rapidly without harm to the device substrate and supports multiple unit operations in a batch process for high throughput and low-cost benefits.

SUMMARY OF THE INVENTION

This invention is directed to a sectional porous carrier design and composition used as a temporary support for handling thin and fragile device substrates in microelectronic operations and enables a simultaneous method of demounting (separating) them from the device substrates in a rapid and efficient manner without damaging the device substrates. When bonding a sectional porous carrier, an adhesive is applied to the device wafer and then brought into contact with the carrier. The result is an impervious bonded stack containing the sectional porous carrier used as temporary rigid support and the device substrate. A sectional porous carrier exhibits regions or sections of its structure such that at least one geometric side is solid (non-porous, impermeable). The structure offers porosity within sections or zones to allow directional fluid penetration to facilitate controlled debonding. For purposes of substrate debonding, porosity is defined as the extent of wicking or chemical diffusion sufficient to saturate the desired region of the carrier where bonding (affixing) occurs with the device substrate. Example designs of a sectional porous carrier constructed with porous materials in a laminated structure that exhibits minimum porosity and sufficient surface finish necessary to be used as a temporary support for electronic devices (FIG. 1). FIG. 1 Illustrates design options A-E for the sectional porous carrier, each comprising a region or section that is porous (#1) and that which is a solid (#2, non-porous, impermeable). For simplicity and clarity of illustration, the drawings are not necessarily drawn to scale. Sectional porous carrier A comprises a porous material #1 laminated to a rigid solid (non-porous) structure #2. The materials are bonded by a laminating and welding or fusion practice deemed sufficient to maintain the structure's sectional porous property. The porous carrier comprises a material #1 that may be present at 1% or more by weight and laminated onto solid structure #2 that represents the remaining percentage balance (i.e. 99% or less). Porous material #1 exhibits a sufficient surface uniformity represented as the total thickness variation (TTV) of the measurements, having values of 10 um (microns) or less. The other example designs shown as B-E follow similar design descriptions as that described for A of the porous material #1 and solid material #2.

A variety of materials may be used in this invention as inorganic and composite structures that comprise both inorganic and organic species. Inorganic materials include metals, ceramics, and salts. Metals may be used in the invention in a variety of forms to produce porous or solid materials, including copper (Cu), nickel (Ni), iron (Fe), cobalt (Co), titanium (Ti), tantalum (Ta), tungsten (W), molybdenum (Mo), chromium (Cr), aluminum (Al), gold (Au), silver (Ag), neodymium (Ne), palladium (Pd), platinum (Pt), osmium (Os), iridinium (Ir), rhodium (Rh), ruthenium (Ru), nitrides thereof, such as titanium nitride (TiN, or TiN$_x$), where x represents the stoichiometry of the thermodynamically stable material, and silicon nitride ($Si_3N_4$), and alloys thereof, such as nickel iron (NiFe) as in the alloy trade name as Invar ($Ni_{40}Fe_{60}$), stainless steel containing chromium, nickel, iron, and other alloyed elements in forms of stainless steel represented as austenitic, ferritic, and martensitic, sufficient to meet the needs of the final structure. The metal composition may exhibit properties of corrosion resistance, low coefficient of thermal expansion (CTE), and rigidity as high modulus.

Ceramics may exist in the invention as solid form materials, varying in porosity, and existing in the invention as crystalline and amorphous composition. Such examples of ceramics include silicon, gallium arsenide, quartz, glass, sapphire, and alloying mixtures thereof. These ceramic and glass materials exist initially as solid structures in the form of sheets, panels, disks, or other form substrates in a design which meets the objective form of the invention. Porous ceramics originate as powders and fibers that are sintered (bonded) into forms that result in structures exhibiting a high degree of porosity.

Sectional porous carriers may be constructed from inorganic materials as various alkali element or related conjugated salts present in a carrier solvent (e.g. water, etc.). Such conjugated salts may exist in an ionic mixture where cations may include ammonium ($NH_4^+$), hydronium ($H_3O^+$) and metals as $M^{+n}$, where M includes Al, Sb, As, Ba, Be, Bi, Cd, Ca, Cr, Co, Cu, Fe, Pb, Li, Mg, Mn, Hg, Ni, K, Sc, Ag, Na, Sr, Sn, and Zn, and n varies from 1 to 5. Anions present in the inorganic mixture may be present as acetates, borates, bromates, carbonates, chlorates, chlorites, chromates, cyanamides, cyanide, dichromates, ferricyanide, ferrocyanide, phosphates, sulfates, nitrate, sulfite, oxide, oxalate, nitride, nitrite, hydroxide, hypochlorite, permanganate, silicate, stannate, stannite, tartrate, thiocyanate, and halogens as $Y^{-x}$, where Y is Br, Cl, F, H, I, O, N, P, and S, and x varies from 1-3. The cations and anions exist as conjugates of each other, as in the case of KCl (i.e. $K^+/Cl^-$).

Organic materials may also be incorporated into the invention design as solids, fillers, or binders, including polyimides such as Kapton® (registered trade mark of E.I. du Pont de Nemours and Company), polyarylether such as Arylite® (registered trade mark of Ferrania), polyesters such as Mylar® (registered trade mark of DuPont Teijin Films), polypropylene, polyethylene, polysulfone (polysulfone, polyethersulfone, polyphenylsulfone) such as Radel® (registered trade mark of Solvay Solexis), polybenzimidazole, polyphenylene sulfide such as Torelina® (registered trade mark of Toray Film Products, Co., Ltd.), polycarbonate, polystyrene, polyacrylic, fluoropolymers as fluoroethylene propylene (FEP), perfluoroalkoxy polymer (PFA), ethyltetrafluoroethylene (ETFE), and ethylene-chlorotrifluoroethylene (ECTE) such as Halar® (registered trade mark of Solvay Solexis), polyvinylidene fluoride (PVDF) such as Kynar® (registered trade mark of Solvay Solexis), polyether ether ketone (PEEK), polyether imide (PEI), polybutylene terephthalate (PBT), polyethylene naphthalate (PEN), and various polyamides classified as nylon. Organic polymers may exist as films or particles, be cast from solutions, or produced from other pathways such as thermo-mechanical forming.

Where a sectional porous carrier comprises an organic material in the form of a film or particle to produce a laminate or composite, it is generally understood that such chemistries may originate from different families that will define the final properties of the carrier substrate. Many of these organic polymers are reactive materials that undergo crosslinking to produce a thermoset. Those familiar with the art recognize that in order to effect the reaction of such chemistries, there must also include the necessary initiators. These initiators are considered as cross-linkers, activators, catalysts, or reactors, and represent a small portion of the overall composition. Therefore, it shall be understood that whenever mention is made about the use of a specific polymer or resin, that material may also include the respective initiator, and the choice of the initiator may produce certain subtle differences, the primary emphasis is that an initiator that is matched with the chemistry of choice must be included in the system.

The sectional porous carrier that is constructed of organic materials may comprise a variety of base resins. The reactive resins include, but are not limited to, those undergoing cross-linking polymerization mechanisms, including epoxies, acrylates and silicones. These systems undergo thermal, chemical, and photo-initiated polymerization by condensation and addition mechanisms as described in the literature as thermosets. Thermoset chemistries offer rigidity and resistance to the process conditions. Non cross-linking resins include those described as amorphous or thermoplastics. The thermoplastic resins may add strength and durability to the adhesive. Additional properties by amorphous polymers include barrier (gas non-diffusion), temperature resistance, transparency, detergency, and water solubility. The following passages offer more detail on the resins used in the construction of a porous carrier, but is not limited to the resins identified here.

Epoxy resins used for this invention may comprise a single or multiple epoxide functional group, also called oxirane, or ethoxyline, normally identified as a three-membered oxide ring described by the following structures classified as (1) glycidyl ethers, (2) glycidyl esters, (3) gylcidyl amines, (4) linear aliphatics, and (5) cycloaliphatics:

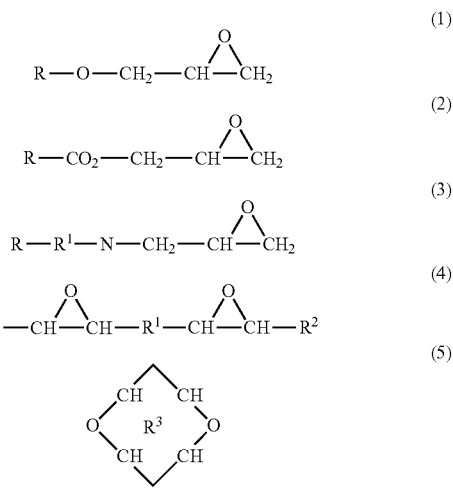

where both R, $R^1$, and $R^2$ may represent the following: hydrogen (—H), amide (—$NH_2$), methyl (—$CH_3$), hydroxyl (—OH), alcohol (—$CH_2OH$), or any one of the groups represented by the formula —$C_nH_{(2n)}$, —$C_nH_{(2n+1)}$, or —$C_nH_{(2n)}OH$ where n varies from 2-20; cyclic and aromatic hydrocarbon functional groups of the formula —$C_6X_5$, where X may be substituent groups such as hydrogen (—H), the halogens (—F, —Br, —Cl, —I), hydroxyl (—OH), and —COOH groups, $R^3$ represents a cyclic or aromatic structure of the formula —$C_6X_5$, where X may be substituent groups such as hydrogen (—H), the halogens (—F, —Br, —Cl, —I), hydroxyl (—OH), and —COOH groups, all of these variations may exist in multiple substituent formats, or monomers, as given in the example structure (6):

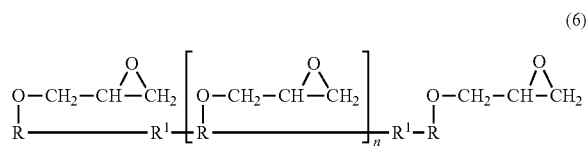

(6)

wherein structure (6) describes a polymer comprising monomers of glycidyl ether with substituent R and linked by $R^1$. Such resins may include: CARDOLITE 514 (difunctional glycidyl ether epoxy resin) produced by Cardolite Corporation, ADEKA EP 4088S (epoxy resin and urethane resin curing agent) produced by Adeka Corporation, EBECRYL3605 (partially acrylated bisphenol-A epoxy) produced by Cytec Industries, Inc.

In one embodiment, the epoxy resin includes that of structure (6), wherein the monomeric epoxide substituent is of the novolac variety, also referred to as epoxidized novolac resin, where R represents an aromatic ring of the form $C_6X_5$, where X may be substituent groups such as hydrogen (—H), the halogens (—F, —Br, —Cl, —I), hydroxyl (—OH), and —COOH groups, and the linkage $R^1$ is best represented by substituents of the formula —$C_nH_{(2n)}$. Such epoxy novolac resins include 3-6 epoxide groups per molecule (n=1.6) of the general formula exhibited by the structure (6). General commercialized products which meet this criteria include: DEN 431 and DEN 439 produced by The DOW Chemical Company; EPON 154, EPON 160 and EPON 161 produced by Resolution Performance Products (Hexion), REZICURE 3056 produced by SI Group.

Acrylic monomers and polymers used in this invention include acrylate esters by the general formula described in item (7), where both $R_1$ and $R_2$ may represent the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20; aromatic hydrocarbon functional groups of the formula —$C_6X_5$, where X may be substituent groups such as hydrogen (—H), the halogens (—F, —Br, —Cl, —I), hydroxyl (—OH), —COOH; and —$COOR_5$ groups, wherein $R_3$ represents the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20.

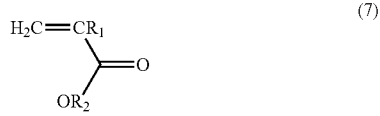

(7)

It is to be understood that where substituent groups are present, they should be present in a manner such that they do not unduly hinder or interfere with the thermal or photo initiated cure of the acrylic monomer. The preferred acrylic monomers are those represented by item (7), wherein $R_1$ is a hydrogen (—H), or methyl (—$CH_3$), defining the molecule as an acrylate or methacrylate, respectively, and $R_2$ to represent a substituent of the form or —$C_nH_{(2n)}OH$ where n varies from 2-20. Such preferred acrylics include hydroxyethyl acrylate (CAS #818-61-1), hydroxypropyl acrylate (CAS #25584-83-2), hydroxyethyl methacrylate (CAS #868-77-9), and hydroxy propyl methacrylate (CAS #27813-02-1). The more preferred acrylic monomers are those represented by item (7), wherein $R_1$ is a hydrogen (—H), or methyl (—$CH_3$), and $R_2$ to represent a substituent of the form amide (—$NH_2$), defining the molecule as an acrylamide. Such preferred acrylics include n,n-dimethylacrylamide (DMAA, CAS #2680-03-7). DMAA has been shown to exhibit high compatibility and solubility for other resins and a significantly faster curing time over the conventional acrylates or methacrylates.

Polysiloxane resins suitable for use herein exist in commerce by multiple suppliers, exhibiting broad classification differences in silicone subcategories, types, and polarities, and reacting through different mechanisms, including addition and condensation polymerization. The use of such materials in the preparation of the adhesive shall consider compatibility and reactivity between the polysiloxanes as a key factor in determining their final behavior. For example, species of similar polarity may be compatible yet be inconsistent in their preferred reaction mechanisms. These include organofunctional polysiloxanes and silicone resin intermediates, both are expected to undergo thermal initiated condensation reactions following hydrolysis. However, vinyl silicones (rubbers) are largely a phobic chemistry and undergo addition reactions with metal catalysts. Therefore, we will differentiate these chemistries accordingly, as their use in an adhesive is expected to follow the same considerations of compatibility and reactivity.

The preferred polysiloxanes include oxysilanes of the formulas represented as $(R_1)$—$[(R_2)(R_3)SiO]_n$—$R_4$ or $(R_5)$O—$[(R_3)_2SiO]_mR_5$, where $R_1$, $R_2$, and $R_3$, may exist as a hydrogen or carbon containing functional group of the variety as alkyl, phenyl, cycloalkyl, alkoxy, hydroxyalkyl, alkoxyalkyl, and hydroxyalkyalkoxy, where these groups may contain up to 6 carbons, and $R_4$ comprises hydrogen, alkyl, or phenyl, where a minimum of 2 of the groups are oxy substituents used for polymerization, and $R_5$ is similar to $R_4$, however, there may exist up to 12 carbons, and n and m varies from 1-5 or to a sufficient number to reach a molecular weight of 500,000.

Siloxane resins suitable for use herein include a broad range of alkyl, aryl, oxygenated, and cyclic substitutions. In the case where thermal resistance is critical, the substitution will be methyl and phenyl. The moieties on the siloxane can also exhibit specific organic functional groups that are well known to interact with the chemistry of the substrate interface. For example, in the case of a mercaptan siloxane moiety, the sulfur group interacts with certain inorganic solid surfaces, such as metals, to increase the interfacial adhesion force. Most importantly, moieties which exhibit epoxy, acrylic, or amine character, are known to interact with a corresponding chemistry within an organic matrix and at the interface of polymeric solid surfaces, resulting in molecular entanglement and van der Waals interactions as hydrogen and covalent bonding, factors which improve the condensation character and density of the structure and believed to improve surface finish.

Silicone resins based on cyclic siloxane molecules are preferred. Useful cyclic silicones are hydroxy functional cyclic silicones classified as liquid resins, flake resins, and silicone intermediates as provided by suppliers Dow Corning and Wacker Silicones (Wacker-Chemie GmbH). Preferred cyclic siloxane choices for adhesive development, include those with high compatibility with other polymers, dissolution in a wide range of solvents, and those classified as silanols. These silanol compounds exhibit relatively high capacity for condensation reactivity and include those with two or more hydroxyl groups per cyclic silicone molecular unit and a phenyl/methyl ratio ranging from 50-120% and a molecular weight ranging from 4,000 to 300,000. In all cases, the relative content of silicon dioxide is high, usually greater than 50%.

The choice of initiator is dependent upon the polymer and the application. Epoxy based systems use organic amine and acid materials to open the oxirane ring and initiate cross-linking These may be promoted by thermal or photo means. Free-radical initiators are used with acrylics, also promoted by applications that apply heat or ultraviolet exposure. Silicone vinyl compounds require metal catalysts to initiate free-radical generation. These classes of initiators and the required media to support polymerization and enable applications of the adhesive to facilitate fixation of the two surfaces. In one embodiment, an epoxy resin system is used with an initiator which is of the polyamine form and of higher molecular weight. Higher molecular weight amine chemistries will remain in the system for longer durations and provide an environment, which efficiently cross-links the epoxy resin. Amines may include triethylenetetramine (TETA), N-methylethanolamine (NMEA), and N-methyldiethanolamine (DMEA) produced by The DOW Chemical Company, and meta-xylenediamine (MXDA) as produced by Mitsubishi Chemical Company. Desirable amine amounts are typically present at levels from about 1% to about 5%, by weight as compared that of the epoxy. A similar approach for epoxies may also be used with acidic materials. The acids tend to have higher reaction rates with epoxies over that of amines. Preferred acids are various sulfonic acids such as toluene, dodecylbenzene, and methane sulfonic acids. The epoxy begins to react upon contact, so the means of mixing and application must be considered. Where acidic reactions are preferred for epoxies are in the case of photo acid generators (PAGs). These systems comprise sulfonium salts which release varying molecular weights of toluene sulfonic acid to cause immediate reaction. This rapid reaction is used in many photoresists. One common photoacid generator is triphenylsulfonium trifluoromethane sulfonate (TPST). Typical amounts of a PAG is in the range of <2% by weight of epoxy.

Initiators for acrylic monomers include thermal (thermal radical initiator, TRI) or photo activated free radical initiators. It is well known from the literature that these free-radical initiated systems will combine with the vinyl group of the acrylic, initiate a chain reaction, whereby the product acrylate free radical combines with other vinyl groups of adjacent acrylics and produce final crosslinked product. These TRI materials include inorganic persulfates such as ammonium persulfate (APS), potassium persulfate, and sodium persulfate, and organic persulfates such as quaternary ammonium persulfates (e.g. tridodecyl ammonium persulfate); peroxides include benzoyl peroxide (BPO), methyl ethyl ketone peroxide, dicumyl peroxide, and benzopinacole (BK), cumene dihydrogen peroxide, and those organic peroxides under the tradename Luperox™ (Arkema, Inc.), azo-compounds including 2,2'-azobisisobutyrnitrile (AIBN), 4,4-azobis(4-cyanovaleric acid), 1,1'-azobis(cyclohexanecarbonitrile), acetates as peracetic acid, and tert-butyl peracetate. Benzoin photoinitiators are common for use as initiators for acrylic chemistry. One type of benzoin photosensitizer is 2-phenylacetophenone, which undergoes photoscission to release radicals of benzoyl, and benzyl, which become the primary chain polymerization initiators in the curing process. Photochemically generated free radicals react directly with the double bond of the vinyl monomer as a chain-initiating step. The invention involves a cure process between a photoinitiator that is present in the liquid polymer system and actinic radiation from an ultraviolet emission source. Common photoinitiators include benzoin ethers, acetophenones, benzoyl oximes, and acylphosphines. These initiators may include phenylglyoxylate, benzyldimethylketal, $\alpha$aminoketone, $\alpha$hydroxyketone, monoacyl phosphine (MAPO), bisacylphosphine (BAPO), metallocene, and iodonium salt. Preferred initiators include 2-hydroxy-2-methyl-1-phenyl-1-propanone (CAS #7473-98-5) and phosphine oxide phenylbis(2,4,6-trimethylbenzoyl)- (CAS #162881-26-7). A trade name product, which represents these materials, includes Irgacure 2022, as manufactured by CIBA Specialty Chemicals, Basel, Switzerland. The product exhibits absorption maxima at 365 nm, 285 nm, and 240 nm. Concentrations are used anywhere at ≤5% by weight.

Organic polymer mixtures that comprise silicone resins may contain anywhere from 20-100% solids of polymers having polysiloxane-vinyl and silyl-hydride character. In the presence of a metal catalyst, the vinyl compounds initiate free radicals that undergo addition polymerization with the silyl-hydride to produce a polymerized final product. To control the reaction rate for application and bonding, there are chelates binding the platinum. During heat exposure, the chelate degrades to release platinum and then triggers polymerization. In the case of silanol polysiloxanes, these monomers will crosslink upon heat exposure, usually in the range 200-250° C.

Additives may be used to improve specific properties in constructing a porous carrier. For example, the use of fluoropolymers are known for surface sensitive activity. The addition of fluoropolymer surfactants meet this objective. Other common surfactants as nonionics or charged species as cationic or anionic are known to provide surface sensitive adjustments to produce a desired surface energy that is conducive to its use. Additives may also contain fillers. These are specifically exemplified by fibrous fillers to improve regional mechanical strength. Particles may also be used to improve mechanical strength and are used to effect porosity. Such materials include glass fiber, asbestos, alumina fiber, ceramic fiber composed of both alumina and silica, boron fiber, zirconia fiber, silicon carbide fiber, metal fibers, polyester fibers, aramid fiber, nylon fibers, phenolic fibers, natural plant and animal fibers; granular or particulate fillers such as fused silica, precipitated silica, fumed silica, calcined silica, zinc oxide, calcined clay, carbon black, glass beads, alumina, talc, calcium carbonate, clay, aluminum hydroxide, barium sulfate, titanium dioxide, aluminum nitride, silicon carbide, magnesium oxide, beryllium oxide, kaolin, mica, zirconia, and so forth; and mixtures of two or more of the preceding.

DETAILED DESCRIPTION OF THE DRAWINGS

The following describes in detail one embodiment of the invention and several variations of that embodiment. This discussion should not be construed, however, as limiting the invention to those particular embodiments. Practitioners skilled in the art will recognize numerous other possible embodiments as well as the ones specifically described. For a definition of the complete scope of the invention, the reader is directed to the appended claims.

This invention describes the combination of a material and its configuration to produce a porous carrier used to temporarily support semiconductor device wafers during several manufacturing processes. The invention may use a range of materials that exhibit proven compatibility with chemicals used in the customer's process. For example, aluminum may be a common and inexpensive metal of choice, however, aluminum is not compatible with many alkaline reagents without proper inhibition of metal corrosion or is not compatible with halogenated acids. Alternatively, stainless may be a better choice, however, this choice is more concerned with the type of halogenated acid and concentration. Teflon™ (a trade name for Du Pont's polytetrafluoroethylene resin) may be a better choice for compatibility, however, the weight of the porous carrier may become excessive, as Teflon™ has a density of 2.2 g/cm$^3$. Other related materials to Teflon™ perfluoroalkoxy (PFA) and fluorinated ethylene propylene (FEP). Teflon™, PFA, and FEP are all related and are thermoplastics, however, they differ in their melting temperatures of >300 C, 300 C, and 260 C, respectively. PFA is considered superior to the others based upon it being used as a coating, such as on aluminum or stainless.

During the processing of a device wafer that is temporarily affixed (bonded) to a sectional porous carrier, it is expected that exposure temperatures may exceed 250 C, and most probably beyond 300 C. In some cases, it has been requested to expose the temporarily bonded device substrates to 450 C. Where processing needs involve low temperature polysilicon (LTPS), material is deposited by vacuum evaporative means and subsequently must be annealed. LTPS annealing requires temperatures in excess of 400 C, preferred to 500 C, and most preferred is reaching temperatures of 600 C. Sectional porous carriers that are meant to temporarily support device wafers must resist such temperatures and do it in a manner that does not result in bending, warping, bowing, or otherwise exhibit deformation in the substrate due to a CTE mis-match. For these temperatures, low CTE value materials are desired by a pure material with an exhibited CTE value lower than 15 ppm, preferred less than 10 ppm, and more preferred less than 5 ppm. Options to pure materials include a mixture of materials and additives that are combined in a manner to elicit low or non-detectable observed values of bending, warping, bowing, or other deformation. In such cases, the materials used in such a mixture may exhibit excessive CTE values, however, the manner that these materials are arranged and configured shall produce a structure that expresses observed characteristics consistent with the same structure that is composed of pure materials of a low CTE value. It shall be assumed that this invention and the varying embodiments described are not restricted by the methods and processes indicated here. One who is familiar with the art shall offer various means of temporary bonding by a sectional porous carrier using the means described here, yet varies in sophistication and cost.

Of primary importance for the invention is to produce a sectional porous structure such that the item exhibits regions or sections of porous character while it performs as a temporary support and facilitates rapid debonding when exposed to a specific liquid chemistry chosen to affect the adhesive interface between the device wafer and carrier. The liquid chemistry diffused through the sectional porous areas of the carrier substrate and operates upon the adhesive at the bondline location between the carrier and device wafer to effect its breakdown and subsequently release the carrier substrate. The carrier release is removed by gravity that exposes additional underlying adhesive remaining on the device wafer where it continues to be affected by the liquid chemistry until cleaning is completed. Following cleaning, the device wafer is rinsed, dried, and becomes ready for the next process step, typically a dicing operation. The porous carrier is sent to a recycle operation where it is cleaned, tested, and readied for repeating the bonding, processing, and debonding practices on additional device wafers. The porous carrier may be recycled up to 10× times, preferred up to 20×, and more preferred at greater than 30×. The cost structure for these options varies with each recycle capacity.

FIG. 1 outlines the invention described as a sectional porous carrier shown to contain a sufficient surface uniformity material 1 in various design configurations with a secondary material 2 identified in A, B, C, D, and E. A surface uniform material 1 is needed for interfacial bonding of the device wafer, yet can exist in configurations with material 2 varying from a thin laminate of approximately 1% by weight or greater in A, to a complete structure of 100% by weight in B, or a laminate that covers the secondary material which may exist at 1% by weight or greater that surrounds item 2 seen as an encapsulated structure C. All of the structures identified in A, B, C, D, and E are considered sectional porous carriers and exhibit properties sufficient to produce the desired main effects. The high surface uniformity and porous material 1 may comprise a converted mesh, screen, or felt (e.g. non-woven fiber material). Examples of simple high surface finish laminate forms of 1 that exist in configuration A, include: filter paper, metal felt, and porous coatings. Material 1 may comprise both inorganic and organic materials. Material 2 may vary from solid form to a porous material. Examples of solid form materials include glass, silicon, or other ceramic sheets or pieces. Porous forms of material 2 include mesh, screen, and non-woven forms that exhibit a high degree of diffusion potential.

During the process that utilizes a bonded wafer structure, the invention porous carrier represented as A, B, C, D, or E is affixed to a device wafer by adhesive to meet minimum properties desired for grinding and polishing with subsequent electronics processing. During the debonding stage, liquid chemical penetrates through the sectional porous regions of the carrier and is brought into direct contact with the adhesive to break it down and effect release from the device wafer. In this fashion and when material 2 is a solid form, chemistries enter the porous layer 1 described in designs A, B, C, D and E from one of the geometrical sides and processing effects upon the bonded wafer stack. In some cases, the chemistries may enter from all angles to include both horizontal and vertical. When these practices are applied to batch processing where multiple device wafer bonded stacks are present in a cassette, the porous carriers allow the liquid chemistry to act upon the bonding adhesive to simultaneously effect release of the carriers.

Various embodiments of the design and construction of the porous carrier substrate are presented here using different materials. The invention porous carrier and its use as a temporary support for device wafers and as a release mechanism during batch processing are not limited by the embodiments presented and shall apply to variations not mentioned here.

EXAMPLES

The compositions of the invention and the method of creating the examples are described. It is understood, however, that the invention is not meant to be limited to the details described therein. In the examples, the percentages provided are percent (%) by weight unless otherwise stated. The invention is further illustrated, without limitation, by the following examples. The measurement of performance and selectivity of the invention is conducted using practices readily accepted by the industry.

To ensure uniformity in thickness and smoothness, all adhesive coatings are produced on a Brewer Science, Inc. CB-100 spin-coater. Metrology data is generated by a XP-1 stylus profiler, using equipment settings 5 mg stylus load, minimum 4 mm distance, and a speed of 0.5 mm/sec. Hot plates are digital controlled systems with aluminum plate protection (www.uvitron.com), furnace support uses box type #ST-1200 C-121216 with microprocessor programming, nitrogen purge, and dispersion fan for chamber uniformity. Thickness is measured using a drop-gauge type, model ID-C112E. Transmittance measurements are conducted with a UV/VIS spectrometer Cary 50. Laboratory goniometer set-up uses in-house digital camera, autopipet, and digital protractor with software to support the Sessile Drop Technique.

Silicon wafers and glass plates (.about.2.5 mm and 0.5 mm thick) are used as an inorganic substrate upon which the adhesive is applied, cured, and subsequent affixing of a porous material is tested. Adhesives used are polyimide, U-Imide C, 35% solids in n,n-dimethylacetamide DMAC, a polyethersulfone, Veradel A-301, worked-up into a coating liquid as 35% solids in DMAC. Chemical surface treatments include: fluoroalkyl silane Dynasylan F8815 and silicone Dow Corning Q1-4010 (www.dowcorning.com). Various other chemicals used for porous metal substrate penetration includes isopropanol (IPA), n-methylpyrollidone (NMP), and Isopar G (isoparrafins). Multiple porous metal samples are used to test and screen surface finish as texture measured as Rq. Detailed studies are conducted on other porous metals in the form of metal felt (non-woven micron-sized wire) as 20BL3 and 40BL3. This material forms the basis for the survey, which the invention is demonstrated.

Example #1

These experiments demonstrate the use of sectional porous metal substrates for electronic applications and for rapid debonding. Thickness, transmittance, and texture is measured. Results are reported in Table 1. A metal woven product, metal screen, (165X1400-304) exhibits <1 um Rq value as texture (surface finish).

TABLE 1

Mechanical properties of several sectional porous metal materials.

| ID | Pattern | Thickness (mm) | % T at 400 nm | Rq (10 5 ang-stroms) | 90 deg. Rq (10 5 ang-stroms) |
|---|---|---|---|---|---|
| 60BL3 | Non-woven (felt) | 0.13-0.14 | 6.42 | 2.41 | 1.78 |
| AL3 | Non-woven (felt) | 0.57-0.58 | 0.67 | 3.59 | 3.21 |
| 60-0075-316 | Woven | 0.34-0.35 | 31.80 | 2.57 | 5.05 |
| 80-0037-316 | Woven | 0.17-0.18 | 50.53 | 1.913 | 4.9 |
| 100-0045-304 | Woven | 0.23-0.24 | 33.57 | 2.89 | 3.73 |
| 100-0045-316 | Woven | 0.22-0.23 | 30.82 | 3.52 | 3.46 |
| 120-0037-304 | Woven | 0.16-0.17 | 33.34 | 3.65 | 3.13 |
| 150-0026-316 | Woven | 0.11-0.12 | 38.20 | 1.41 | 3.04 |
| 150-0037-304 | Woven | 0.10-0.11 | 39.40 | 2.94 | 3.07 |
| 165x1400-304 | Woven | 0.12-0.13 | 0.02 | 0.989 | 0.802 |
| 200-0016-316 | Woven | 0.04-0.06 | 44.92 | 2.66 | 3.08 |

Example #2

In an effort to demonstrate the dynamic leveling effect of the porous carrier that occurs during bonding, total thickness variation (TTV) is measured on metal non-woven felt before and after bonding to a glass substrate. Bonding adhesive includes polyimide that is applied by spin coating to glass, soft baked to 100 C for 5 min, bonding with a <5 psi weight 10 min, and hard baking to 250 C followed by 350 C for 5 min and 10 min, respectively. In this case, the metal felt 40BL3 is used for bonding and TTV measurements. The TTV results are shown in Table 2.

TABLE 2

TTV measurements before and after bonding. Results show that TTV reduces with a porous metal carrier by having an avenue of travel and leveling for the adhesive.

| Glass Plate (um) | Metal Felt 40BL3 (um) | Glass + Metal Felt + Adhesive (um) |
|---|---|---|
| 2 um | 29 um | 12 um |

Example #3

Efforts to demonstrate a reduction of irregularities of bow and warp due to CTE mis-matched materials is best conducted with different thickness of glass (varying modulus). Thick glass exhibits higher modulus vs. thin glass. Higher modulus expresses as a reduced bow and warp during such dynamic testing. The test will measure the effects of metal non-woven felt bonded to glass substrates of different thicknesses (i.e. 0.55 mm and 1.85 mm). The metal felts P/N 20BL3 & 40BL3 used for this application have observed similar thicknesses .about.170 um and .about.200 um, respectively. A low CTE and crosslinking polyimide is applied by spin coating to glass, soft baked to 100 C for 5 min, bonded to the metal felt with <5 psi weight 10 min, and hard baked to 250 C and 350 C for 5 min and 10 min, respectively. Thickness is .about.10 um. As the bonded substrate cools from 350 C to ambient, the metal felt bonded specimens exhibit bow/warp of the glass. The corresponding bow/warp results are shown in Table 3.

TABLE 3

Bow/warp measurements after bonding and cooling from 350 C. to room temp.

| Glass Plate (mm) | Bow/warp of glass + Metal Felt 20BL3 (mm) | Bow/warp of glass + Metal Felt 40BL3 (mm) |
|---|---|---|
| 0.55 | 2.5 | 3.2 |
| 1.85 | 0.7 | 1.0 |

Example #4

Wicking tests by chemical diffusion are tested by observing liquids being dropped onto the surface of a porous metal felt (P/N 60BL3, and observing if the liquid drop will penetrate into the felt matrix and be observed, or remain on the surface and not "wet" the surface. A metal porous felt is exposed to specific chemicals that result in a specific surface treatment to cause a phobic surface to develop. Phobic surfaces are not wetted by philic liquids and when measuring contact angle, treated surfaces will effect greater contact angles. Following surface treatment with various chemical agents, the contact angle is measured by goniometer practices. Surface treatment follows different reagents applied to the metal felt and allowed to cure. Subsequent testing of chemical penetration is conducted with chemicals and observing their ability to "wet" the metal felt.

TABLE 4

Surface treatment, contact angle, and chemical wetting of metal felt (60BL3).

| Treatment | Contact Angle | DIW | IPA | NMP | Isopar G |
|---|---|---|---|---|---|
| Silicone | 101.02 | No | slow | No | Yes |
| F 8815 | 107.87 | No | No | No | No |
| None | 60.6 | No | Yes | Yes | Yes |

What is claimed is:

1. A manufacturing process of a device substrate comprising the steps of:
    applying adhesive to the device substrate, wherein the adhesive is impervious to process chemicals, and affixing the device substrate to a nonwoven felt sectional non-perforated porous carrier so as to form a temporary impervious support, with a sectional porous carrier surface uniformity of 10 micron total thickness variation;
    moving the temporary impervious support by a handling robot;
    processing the temporary impervious support with process chemicals; and
    allowing subsequent selective diffusion of releasing liquids through the nonwoven felt porous support to directly penetrate and contact adhered regions, causing release of the carrier without harm to the corresponding device substrate, wherein the nonwoven felt is subjected to an additional surface treatment step with silicone or fluoro siloxane additives to provide for selective diffusion through the nonwoven felt using chemical exclusion and
    wherein the temporary imperviousness of the support derives from the positioning of the device substrate covering the porous section of the carrier surface, from the impervious nature of the adhesive, and from the surface treatment of the nonwoven felt.

2. The manufacturing process of claim 1 wherein the device substrate is a semiconductor.

3. The manufacturing process of claim 1 wherein the device substrate is a display.

4. The manufacturing process of claim 1 where the nonwoven felt comprises metal fibers.

5. The manufacturing process of claim 1 where the nonwoven felt comprises glass fibers.

6. The manufacturing process of claim 1 where the nonwoven felt comprises organic polymeric fibers.

7. A manufacturing process of a device substrate as in claim 1 where the temporary impervious support comprises the nonwoven felt inset into a separate impervious section of the carrier and adhered subsequently to the device substrate so as to form a temporary impervious support more resistant to interaction with device process chemicals as compared to releasing liquids.

8. A manufacturing process of a device substrate as in claim 1 comprising the additional step of subjecting the nonwoven felt to a surface treatment to provide for selective diffusion through the nonwoven using chemical exclusion, wherein surface treatment creates a contact angle for water at greater than 90 degrees when measured by the Sessile Drop Technique.

* * * * *